United States Patent [19]
Chu

[11] Patent Number: 5,228,939
[45] Date of Patent: Jul. 20, 1993

[54] SINGLE WAFER PLASMA ETCHING SYSTEM

[76] Inventor: Cheng Chu, 5373 Bothe Ave., San Diego, Calif. 92122

[21] Appl. No.: 814,868

[22] Filed: Dec. 30, 1991

[51] Int. Cl.$^5$ .......................................... H01L 21/00
[52] U.S. Cl. ................................. 156/345; 156/643; 118/723; 204/298.34; 204/298.31; 204/298.02
[58] Field of Search ............... 156/345, 643; 118/723; 204/298.34, 298.31, 298.02

[56] References Cited

U.S. PATENT DOCUMENTS

| | | | |
|---|---|---|---|
| 4,626,312 | 12/1986 | Tracy | 156/345 |
| 4,871,421 | 10/1989 | Ogle et al. | 156/643 |

FOREIGN PATENT DOCUMENTS

| | | | |
|---|---|---|---|
| 213026 | 10/1985 | Japan | 156/345 |
| 610239 | 1/1986 | Japan | 156/345 |
| 123721 | 6/1987 | Japan | 156/345 |
| 76434 | 4/1988 | Japan | 156/345 |
| 250314 | 10/1990 | Japan | 156/345 |

Primary Examiner—Brian E. Hearn
Assistant Examiner—George A. Goudreau
Attorney, Agent, or Firm—Bo-In Lin

[57] ABSTRACT

The present invention provides an apparatus and a method to improve the single wafer RF plasma etching. A plasma etching apparatus including an etching chamber having a first electrode and a second electrode disposed in the etching chamber with a wafer to be etched disposed on the first electrode. The etching chamber having a chamber reference voltage and the first and the second electrodes being electrically isolated from the etching chamber. The plasma etching system also has an RF generator producing a radio frequency input voltage and a voltage and phase controller electrically connected to the RF generator. The voltage and phase controller is further connected to the first electrode and the second electrode to generate in the first electrode and the second electrode two corresponding voltages substantially equal in magnitude but of opposite signs relative to said chamber reference voltage and further that the first electrode always has a lower voltage than the second electrode such that the ionized particles move to the wafer disposed on the first electrode through the entire RF cycle.

2 Claims, 3 Drawing Sheets

SINGLE WAFER PLASMA ETCHING SYSTEM

BACKGROUND OF THE INVENTION

1. Field of the Invention

This invention relates generally to the apparatus and process used in plasma-based etching. More specifically, this invention teaches an apparatus and a process to perform plasma etching which reduces electrode damages and impurity particles in a plasma etching chamber caused by bombardment of energetic charged particles onto the counter electrode.

2. Description of the Prior Art

A single parallel-plate plasma etching system used in integrated circuit (IC) manufacture to etch one wafer at a time is limited by several difficulties including the problems of stray electric discharges and that one of the two parallel electrodes is exposed to and being bombarded by energetic charged particles without the protection of a wafer. Since our ability to develop and build ever so smaller microelectronic devices depends strongly on the capability to generate a desired device pattern in an image layer by lithography and then transfer this pattern into the layers of materials wherein the devices are developed, performance improvement in plasma etching is critically important. Parallel plate plasma etching system commonly used in dry etching processes offer higher accuracy in replicating device patterns than wet etching processes.

A parallel plate plasma etching system generally has a reactor chamber containing a pair of electrodes to which RF power is applied. A wafer including a film thereon to be etched is then placed on one of the electrodes. The electrode whereon the wafer is placed is commonly referred to as a chuck electrode whereas the opposite electrode without a wafer is termed as a counter electrode. Suitable gases are injected into the chamber and plasma is formed to etch the film. High or low radio frequencies are used in the etching process dependent upon the type of film being etched. Such a system is called a single wafer parallel plate plasma etching system.

In order to enhance the etch rate, it is desirable to induce a high voltage across the electrodes, imparting high energy levels to the system. One undesirable consequence of applying high voltage across the electrodes is the resulting excessive stray electrical discharges from the electrodes to the reactor chamber wall and other parts in the system. In order to circumvent this problem, several designs are proposed to minimize the potential difference between either electrode and the reactor chamber wall while maintaining a high voltage difference between the two electrodes.

U.S. Pat. No. 4,626,312 to Tracy entitled "Plasma Etching System for Minimizing Stray Electrical Discharges" (Dec. 2, 1986), proposes that stray electrical discharges may be reduced by dividing the applied voltage between the chuck and counter electrodes while maintaining the etching chamber at a ground potential. Because of the asymmetries in the construction of the reactor vessel, electrodes, and electrical feed lines, as well as the unbalanced impedance load placed on the counter electrode by the wafer, a precise division of the voltage can not be fully effected and the theoretical maximum voltage can not be realized.

U.S. Pat. No. 4,871,421 to Ogle and Yin entitled "Split Phase Driver for Plasma Etch System" (Oct. 3, 1989) utilizes an elaborated split-phase driver to deal with the problem of intrinsic electrical asymmetry of single wafer system in order to achieve a precise 180 degree phase difference and therefore the maximum voltage difference between the two electrodes.

In maximizing the electrode voltage difference by the use of split phase driver as that proposed by Ogle et al., a single wafer etching system is still limited by the unresolved problem that during the half cycle of the RF voltage when the chuck electrode having a voltage higher than that at counter electrode, current flows from chuck electrode to counter electrode. Energetic ions bombard the counter electrode instead of the wafer disposed on chuck electrode. Consequently, damage of counter electrode occurs while the electrode is bombarded by ions without the shielding of a wafer. Impurities generated as the result of the ion bombardments mixed with the plasma also degrades the etching performance.

SUMMARY OF THE PRESENT INVENTION

Accordingly, one object of the present invention is to provide a parallel plate plasma etching system with maximum differential voltage between the electrodes for efficient etching and meanwhile it has minimum average differential voltage relative to the etching chamber such that the stray discharges between the electrodes and the chamber are minimized.

It is another object of the present invention to provide a parallel plate plasma etching system wherein the electrode with a wafer for etching, i.e., the chuck electrode, always has a lower voltage than the counter electrode thereby the electrode damages and impurity particles in a plasma etching chamber caused by bombardment of energetic charged particles onto the counter electrode are reduced.

It is another object of the present invention to provide a plasma etching system which reduces electrode damages and impurity particles in a plasma etching chamber by simply replacing the RF voltage and phase controller from those used by conventional etching systems without elaborate redesigns and reconfigurations.

It is another object of this invention to teach a plasma etching system to prolong the useful life of the electrodes by reducing the ion bombardment onto the surface of a counter electrode.

It is a further object of this invention to provide a plasma etching system with improved etching efficiency by maintaining the counter electrode at a higher voltage than the chuck electrode thus keeping the etching process operative through the entire RF cycle.

The present invention provides an apparatus and a method to improve the single wafer RF plasma etching. Briefly, a plasma etching apparatus including an etching chamber having a first electrode and a second electrode disposed in the etching chamber with a wafer to be etched disposed on the first electrode. The etching chamber having a chamber reference voltage and the first and the second electrodes being electrically isolated from the etching chamber. The plasma etching system also has an RF generator producing a radio frequency input voltage and a voltage and phase controller electrically connected to the RF generator. The voltage and phase controller is further connected to the first electrode and the second electrode to generate in the first electrode and the second electrode two corresponding voltages substantially equal in magnitude but of opposite signs relative to said chamber reference voltage and further that the first electrode always has a lower voltage than the second electrode such that the ionized particles move to the wafer disposed on the first electrode through the entire RF cycle.

It is an advantage of the present invention that the parallel plate plasma etching system has a maximum differential voltage between the electrodes for efficient etching and meanwhile it has minimum average differential voltage relative to the etching chamber such that the stray discharges between the electrodes and the chamber are minimized.

It is another advantage of the present invention that in the parallel plate plasma etching system the electrode with a wafer for etching, i.e., the chuck electrode, always has a lower voltage than the counter electrode thereby the electrode damages and impurity particles in a plasma etching chamber caused by bombardment of energetic charged particles onto the counter electrode are reduced.

It is another advantage of the present invention that a plasma etching system which reduces electrode damages and impurity particles in a plasma etching chamber can be provided by simply replacing the RF voltage phase controller from those used by conventional etching systems without elaborate redesigns and reconfigurations.

It is another advantage of this invention that in a plasma etching system the useful life of the electrodes is prolonged by reducing the ion bombardment onto the surface of a counter electrode.

It is a further advantage of this invention to provide a plasma etching system with improved etching efficiency by maintaining the counter electrode at a higher voltage than the chuck electrode thus keeping the etching process operative through the entire RF cycle.

Other objects and advantages of the present invention will be apparent and suggest themselves to those skilled in the art, from a reading of the following specification and claims, taken in conjunction with the accompany drawings.

DESCRIPTION OF THE PREFERRED EMBODIMENT

Figure 1:
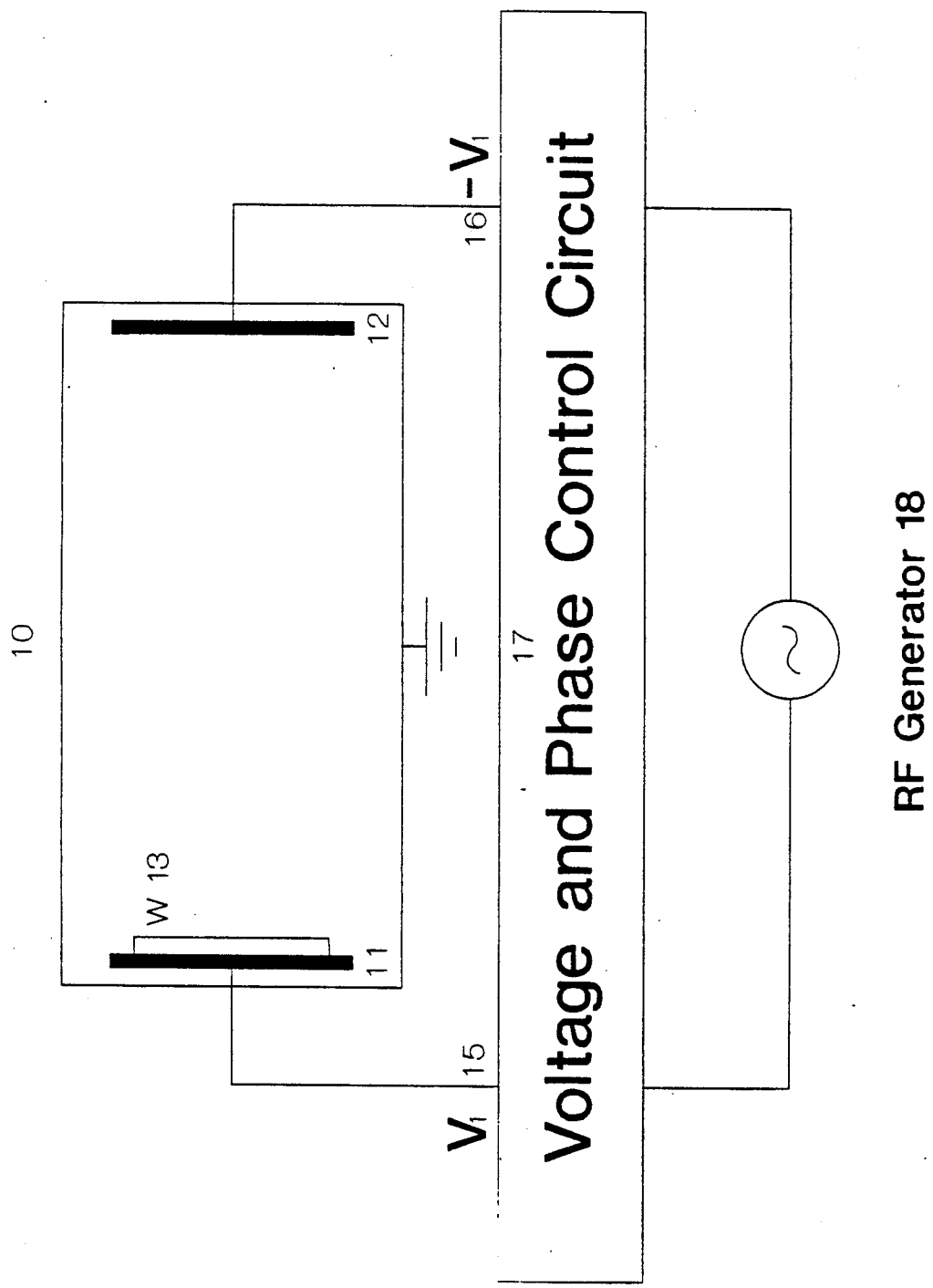
FIG. 1 is a schematic illustration of an embodiments of the present invention.

Referring to FIG. 1, an RF plasma etching system comprises a plasma etching chamber 10. The walls of the chamber may be grounded or maintained at some reference potential. Chuck electrodes 11 and counter electrode 12 are isolated from the walls of the chamber and electrically connected to terminals 15 and 16, respectively. Wafer 14 with appropriate film is disposed on chuck electrode 11.

Figure 2:
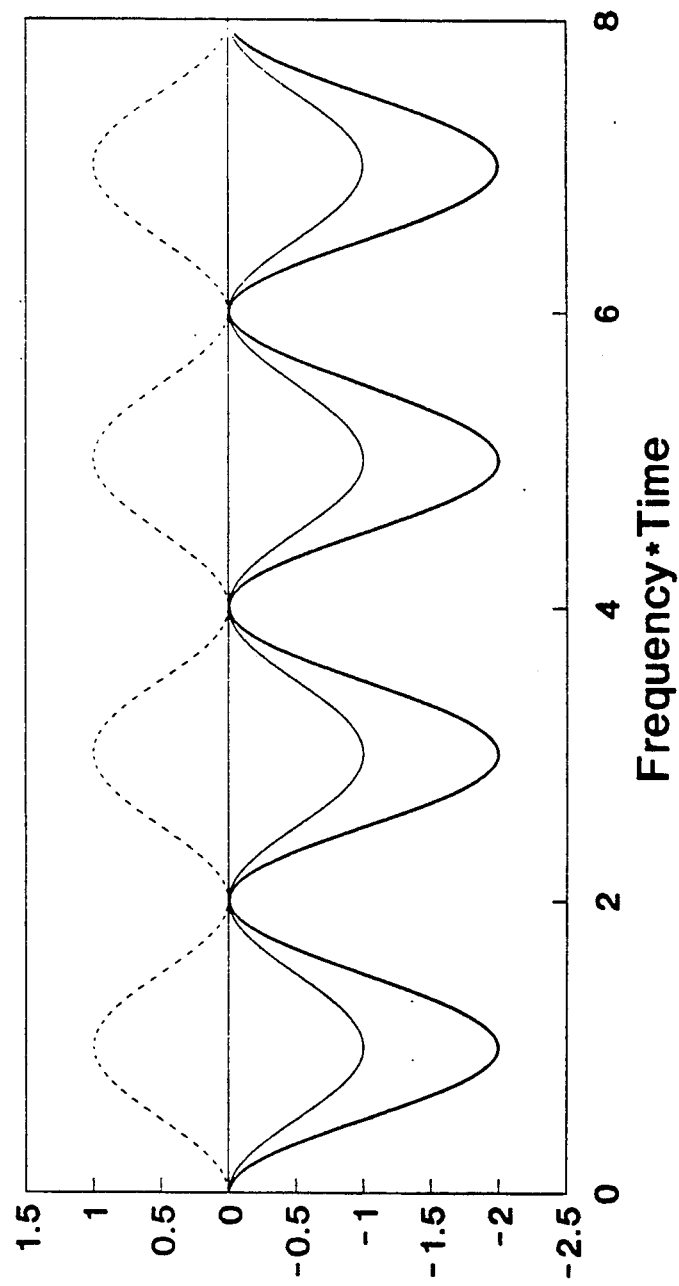
FIG. 2 is an RF voltage waveform applied to the electrodes showing that the voltage at counter electrode is always higher than that at chuck electrode.

Electric power from a RF generator 18 via control circuit 17 is delivered to terminals 15 and 16. The control circuit 17 be designed to provide equal-magnitude, opposite-sign voltages at terminal 15 and 16. A typical waveform is shown in FIG. 2. The voltage at terminal 16 is equal to the voltage at terminal 15 with a minus sign. Suitable gases may be injected into the chamber 10 and ionized by the RF power. As shown in FIG. 2, the voltage applied to counter electrode is always higher relative to that at chuck electrode, electric current is always flowing from counter electrode 12 to chuck electrode 11 where the wafer 13 with a film to be etched is disposed. Therefore, the energy delivered to electrodes 11 and 12 is more efficiently utilized to etch wafer 13 compared to the conventional etching process where only half of the entire RF cycle is used. In addition, impurities resulting from bombardment of ions on counter electrode 12 are minimized because of the voltage waveform provided in the present invention.

Figure 3:
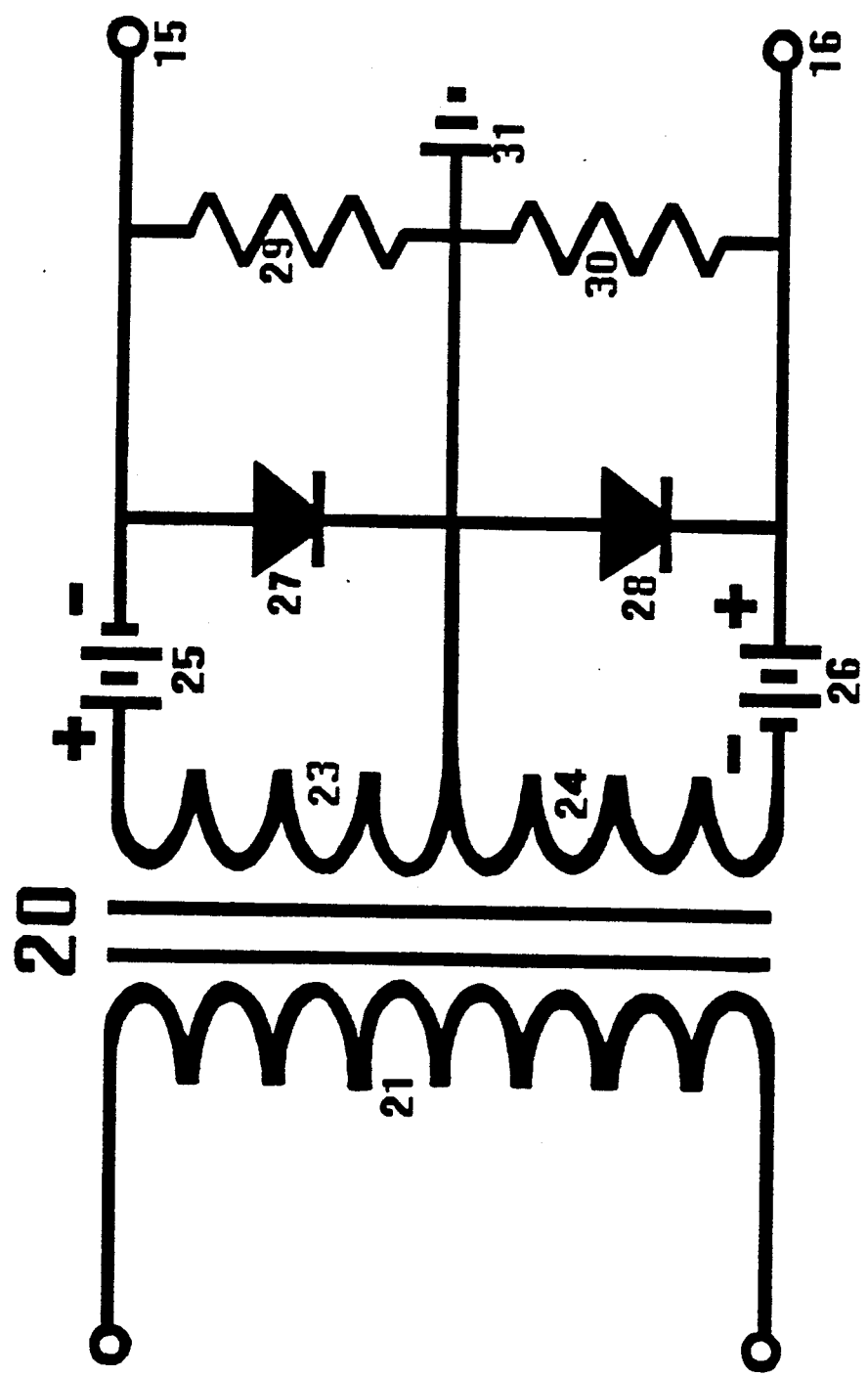
FIG. 3 is a schematic illustration of a voltage and phase control circuit to generate the RF waveform as that shown in FIG. 2.

FIG. 3 depicts a phase and voltage control circuit 17 used to generate the voltage waveform as that shown in FIG. 2. An RF voltage source 18 is connected to a matching transformer 20 including a primary winding 21 and two secondary windings 23 and 24 with a ground center tap 31. DC voltage sources 25 and 26 provide the necessary DC biases and rectifiers 27 and 28 assure that voltage waveform at terminal 15 is always less than zero whereas the voltage at terminal 16 is always greater than zero. By adjusting the ratio of DC voltage to AC voltage and AC input waveform, a great variety of waveforms with a predefined amplitudes and frequencies can be generated. Control circuit 17 is one example of a preferred embodiment. Many other circuit designs are available and therefore can be implemented to generate the voltage waveform as that shown in FIG. 2 to achieve the objects of the present invention.

Because many of the details relating to components such as cooling, vacuum pumping, control circuit, and other elements involved are well known to those of ordinary skill in the art and are readily available through conventional means and only indirectly related to the invention, they are not illustrated or described in detail for purpose of clarity.

While the invention has been shown and described with reference to the embodiment above, it will be understood by those skilled in the art that various changes in forms and details may be made therein without departing from the essence, scope, and teaching of the invention. For example, any type of control circuit may be used, such as inductive, capacitive, resistive or some combinations. A wide spectrum of RF power may be used. Accordingly, the invention disclosed herein is to be limited only as specified in the following claims.

I claim:

1. A plasma etching apparatus comprising:
    an etching chamber including a chuck electrode and a counter electrode disposed in the etching chamber having a chamber reference voltage and electrically isolated from said chuck and said counter electrodes;
    an RF generator producing a radio frequency input voltage; and
    a voltage-and-phase controller electrically connected to the RF generator and said chuck electrode and said counter electrode to generate a chuck electrode voltage and a corresponding counter electrode voltage, said chuck electrode voltage being always negative and said corresponding counter electrode voltage being always positive relative to said chamber reference voltage, and are of substantially equal magnitude relative to said chamber reference voltage through the entire RF cycle.

2. A plasma etching apparatus of claim 1 wherein said voltage-and-phase controller further comprising:

a matching transformer connected to said RF generator including a primary winding, a first secondary winding and a second secondary winding in series connection and opposite said primary winding;

a ground center tap with a ground potential disposed between said first and said second secondary windings;

a first DC voltage source providing a positive DC bias to said first secondary winding opposite said ground center tap wherein the negative terminal of said first DC voltage source being connected to said chuck electrode, and a second DC voltage source providing a negative DC bias to said second secondary winding opposite said ground center tap wherein the positive terminal of said second DC voltage source being connected to said counter electrode; and a first rectifier connected between the negative terminal of said first DC source and said ground center tap for maintaining said chuck electrode at negative voltage, and a second rectifier connected between the positive terminal of said second DC source and said ground center tap for maintaining said counter electrode at positive voltage.

* * * * *